United States Patent
Kawaguchi et al.

(10) Patent No.: US 8,502,309 B2
(45) Date of Patent: Aug. 6, 2013

(54) SEMICONDUCTOR DEVICE INCLUDING FIELD EFFECT TRANSISTOR FOR USE AS A HIGH-SPEED SWITCHING DEVICE AND A POWER DEVICE

(75) Inventors: Yusuke Kawaguchi, Miura-gun (JP); Norio Yasuhara, Kawasaki (JP); Tomoko Matsudai, Tokyo (JP); Kenichi Matsushita, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 299 days.

(21) Appl. No.: 12/645,072

(22) Filed: Dec. 22, 2009

(65) Prior Publication Data

US 2010/0096696 A1  Apr. 22, 2010

Related U.S. Application Data

(63) Continuation of application No. 11/501,715, filed on Aug. 10, 2006, now Pat. No. 7,646,059.

(30) Foreign Application Priority Data

Aug. 11, 2005 (JP) ................. 2005-233428
Aug. 8, 2006 (JP) ................. 2006-215204

(51) Int. Cl.
*H01L 29/76* (2006.01)
*H01L 29/94* (2006.01)
*H01L 31/062* (2006.01)
*H01L 31/119* (2006.01)

(52) U.S. Cl.
USPC ............ 257/339; 257/E29.066; 257/336; 257/343

(58) Field of Classification Search
USPC ............ 257/335, 336, 339, 343, E29.066
See application file for complete search history.

(56) References Cited

U.S. PATENT DOCUMENTS

| 5,374,843 A | 12/1994 | Williams et al. |
| 5,932,897 A | 8/1999 | Kawaguchi et al. |

(Continued)

FOREIGN PATENT DOCUMENTS

| JP | 58-127380 | 7/1983 |
| JP | 2-180074 | 7/1990 |

(Continued)

OTHER PUBLICATIONS

Edouard de Fresart, et al., "Integration of Multi-Voltage Analog and Power Devices in a 0.25 μm CMOS + Flash Memory Process", Proc. of ISPSD'02, IEEE, 2002, pp. 305-308.

(Continued)

*Primary Examiner* — Shouxiang Hu
(74) *Attorney, Agent, or Firm* — Oblon, Spivak, McClelland, Maier & Neustadt, L.L.P.

(57) ABSTRACT

A body layer of a first conductivity type is formed on a semiconductor substrate, and a source layer of a second conductivity type is formed in a surface region of the body layer. An offset layer of the second conductivity type is formed on the semiconductor substrate, and a drain layer of the second conductivity type is formed in a surface region of the offset layer. An insulating film is embedded in a trench formed in the surface region of the offset layer between the source layer and the drain layer. A gate insulating film is formed on the body layer and the offset layer between the source layer and the insulating film. A gate electrode is formed on the gate insulating film. A first peak of an impurity concentration profile in the offset layer is formed at a position deeper than the insulating film.

26 Claims, 15 Drawing Sheets

U.S. PATENT DOCUMENTS

| | | | |
|---|---|---|---|
| 7,646,059 B2 * | 1/2010 | Kawaguchi et al. | 257/339 |
| 2001/0015459 A1 | 8/2001 | Watanabe et al. | |
| 2001/0036694 A1 | 11/2001 | Kikuchi et al. | |
| 2002/0030225 A1 | 3/2002 | Nakamura et al. | |
| 2002/0050619 A1 | 5/2002 | Kawaguchi et al. | |
| 2002/0197782 A1 | 12/2002 | Kitamura | |
| 2005/0153527 A1 | 7/2005 | Kitamura | |

FOREIGN PATENT DOCUMENTS

| | | |
|---|---|---|
| JP | 8-88357 | 4/1996 |
| JP | 8-97411 | 4/1996 |
| JP | 2003-37267 | 2/2003 |
| JP | 2003-60204 | 2/2003 |
| JP | 2004-165648 | 6/2004 |
| JP | 2006-210532 | 8/2006 |
| JP | 2006-253334 | 9/2006 |

OTHER PUBLICATIONS

Japanese Office Action for Japanese Patent Application No. 2006-215204 dated Aug. 4, 2011 with English translation.

* cited by examiner

PRIOR ART

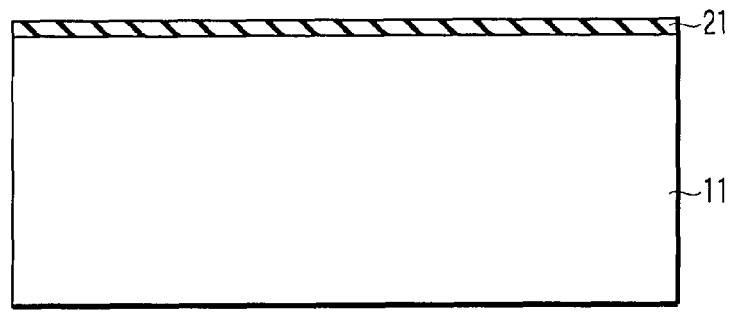
FIG. 6
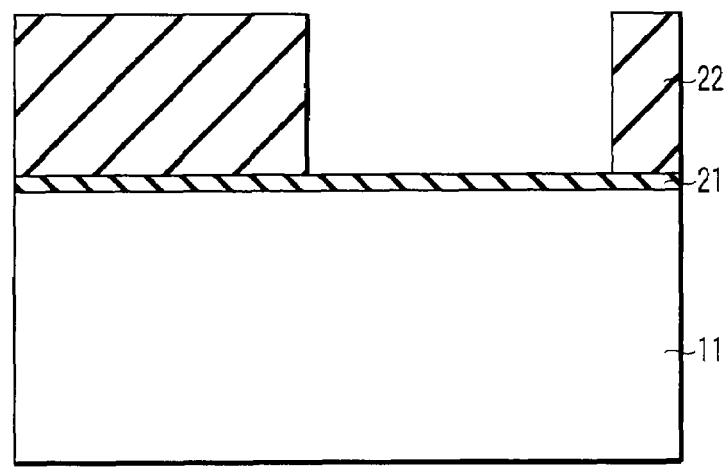
FIG. 7A
FIG. 7B

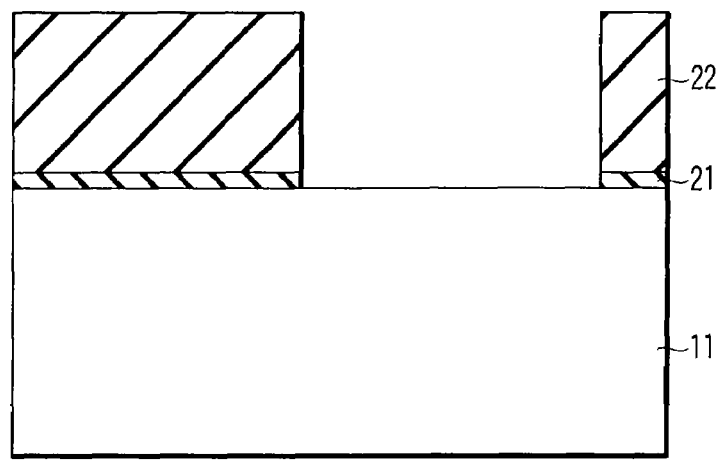
F I G. 8A
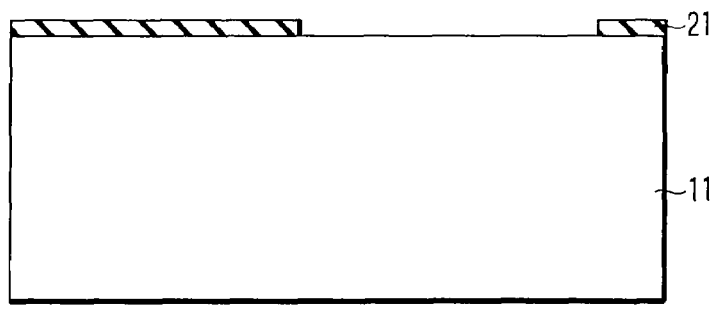
F I G. 8B
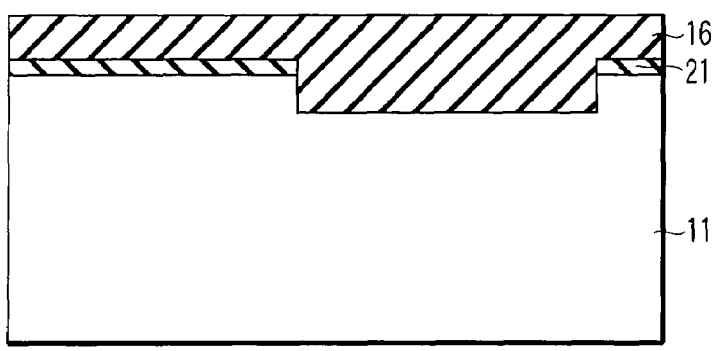
F I G. 8C

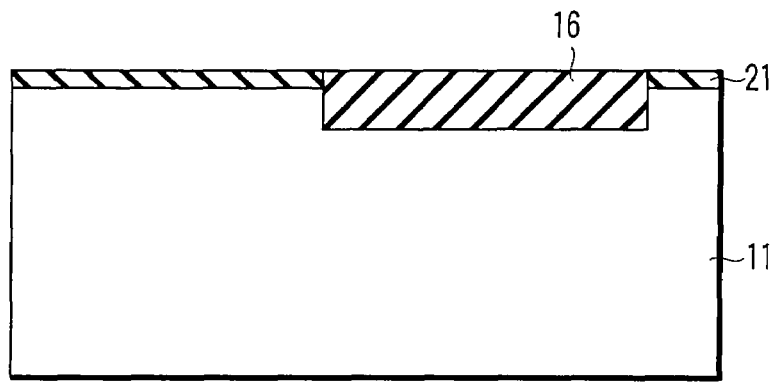
F I G. 9A
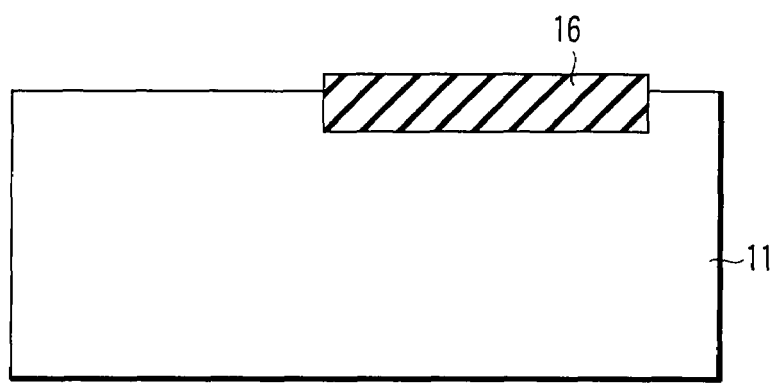
F I G. 9B
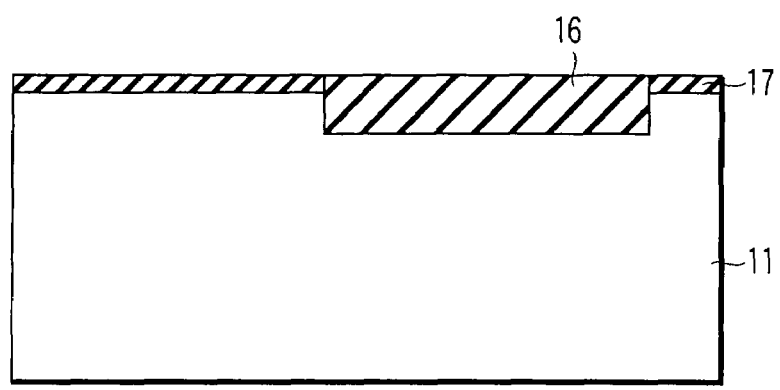
F I G. 9C

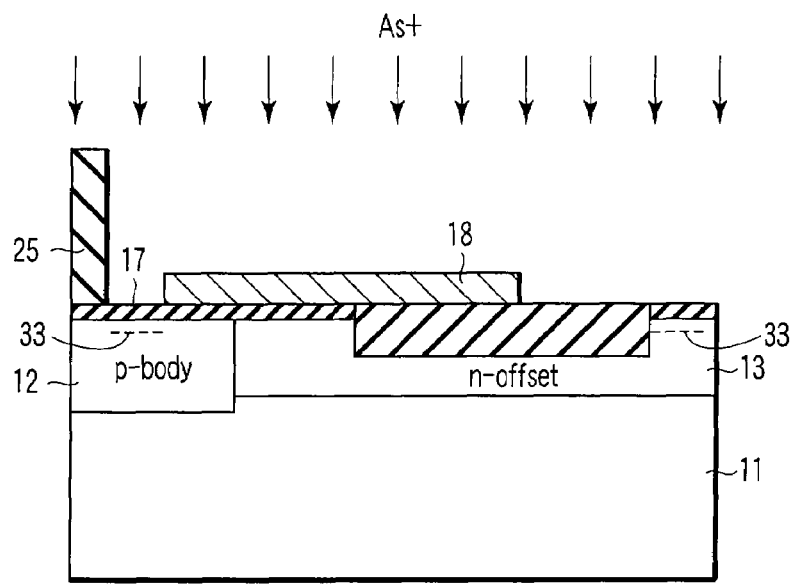
F I G. 12A
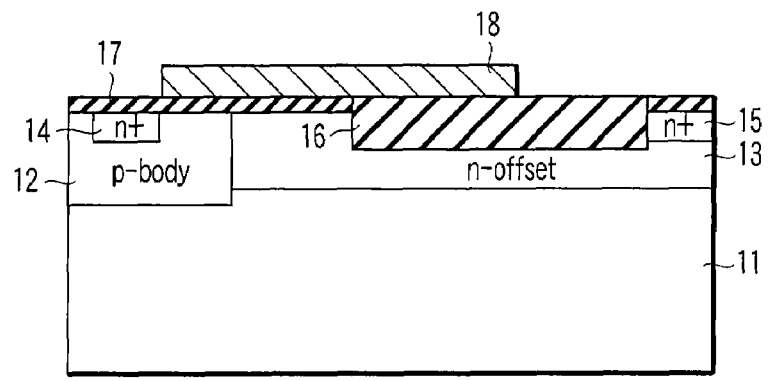
F I G. 12B
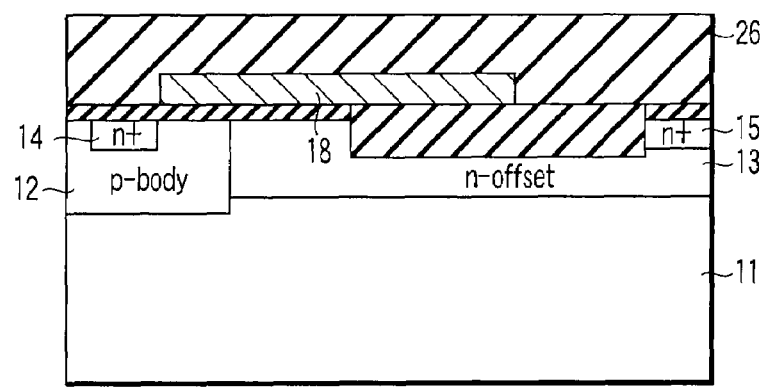
F I G. 12C

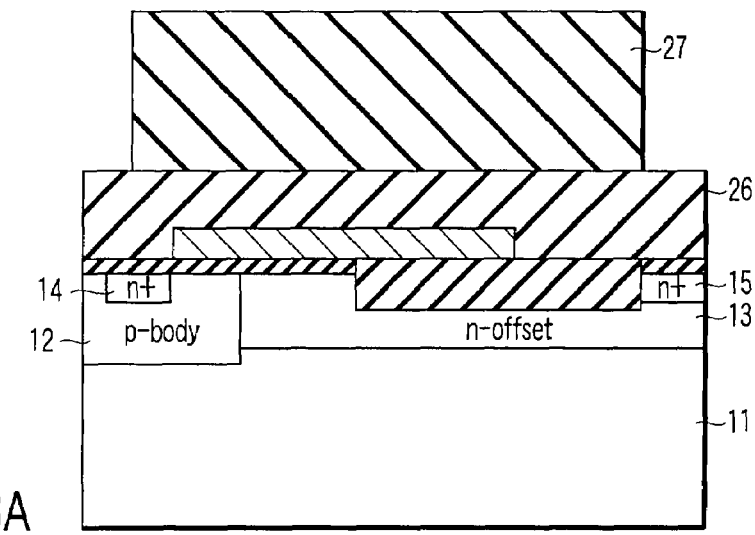
F I G. 13A
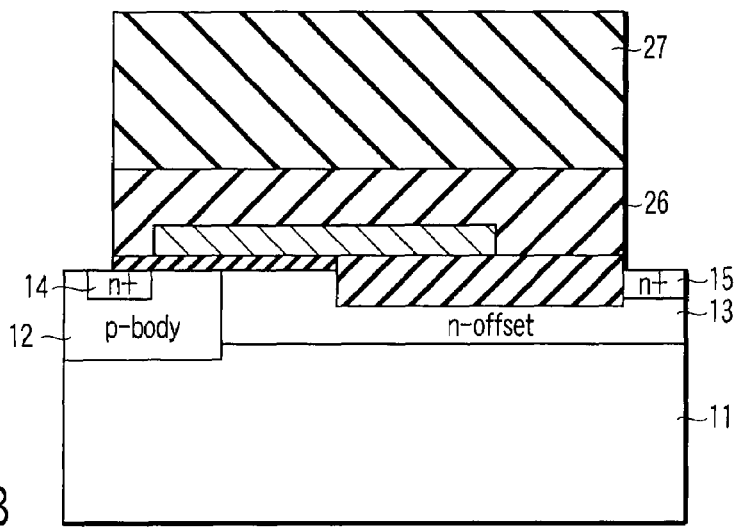
F I G. 13B
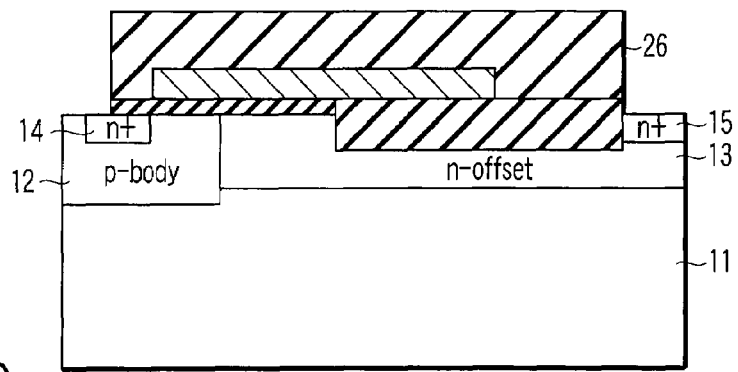
F I G. 13C

SEMICONDUCTOR DEVICE INCLUDING FIELD EFFECT TRANSISTOR FOR USE AS A HIGH-SPEED SWITCHING DEVICE AND A POWER DEVICE

CROSS-REFERENCE TO RELATED APPLICATIONS

This is a continuation of U.S. application Ser. No. 11/501,715 filed on Aug. 10, 2006 which is an application based upon and claims the benefit of priority from prior Japanese Patent Applications No. 2005-233428, filed Aug. 11, 2005; and No. 2006-215204, filed Aug. 8, 2006, the entire contents of both of which are incorporated herein by reference.

BACKGROUND OF THE INVENTION

1. Field of the Invention

This invention relates to a semiconductor device for use as a high-speed switching device and a power device, and relates, for example, to a horizontal-type field effect transistor.

2. Description of the Related Art

Heretofore, a power IC has been known in which there are formed, on the same substrate, a high withstand voltage semiconductor element for use in, for example, a high withstand voltage drive circuit, and a low withstand voltage semiconductor element for use in, for example, a low withstand voltage drive circuit. Many uses have been conceived regarding the power IC. Low on-resistance is required in a MOS field effect transistor having a high withstand voltage structure (hereinafter, a high voltage MOSFET) for use in an output stage of the power IC of this kind. To achieve the low on-resistance, the high voltage MOSFET is generally manufactured by a micro-process.

Meanwhile, as progress has been made in miniaturization and the high voltage MOSFET has come to be manufactured under the rule of 0.25 μm or less, an element separation region is changed from LOCOS to shallow trench isolation (STI). A high voltage MOSFET having a structure in which an element separation region is formed by the STI is described in, for example, Jpn. Pat. Appln. KOKAI Publication No. 2003-37267. In the high voltage MOSFET having such a structure, for example, in an element of a withstand voltage 20 V system, there may occur a problem that a source-drain voltage snaps back at about 15 V when a gate is on.

BRIEF SUMMARY OF THE INVENTION

According to a first aspect of the present invention, there is provided a semiconductor device comprising: a body layer of a first conductivity type formed on a semiconductor substrate; a source layer of a second conductivity type formed in a surface region of the body layer; an offset layer of the second conductivity type formed on the semiconductor substrate; a drain layer of the second conductivity type formed in a surface region of the offset layer; an insulating film embedded in a trench formed in the surface region of the offset layer between the source layer and the drain layer; a gate insulating film formed on the body layer and the offset layer between the source layer and the insulating film; and a gate electrode formed on the gate insulating film. A first peak of an impurity concentration profile in the offset layer is formed at a position deeper than the insulating film.

According to a second aspect of the present invention, there is provided a semiconductor device comprising: a first semiconductor layer of a first conductivity type formed on a semiconductor substrate; a second semiconductor layer of a second conductivity type formed on the semiconductor substrate adjacently to the first semiconductor layer; a third semiconductor layer of the second conductivity type formed in a surface region of the first semiconductor layer, the third semiconductor layer having an impurity concentration higher than that of the second semiconductor layer; a fourth semiconductor layer of the second conductivity type formed in a surface region of the second semiconductor layer, the fourth semiconductor layer having an impurity concentration higher than that of the second semiconductor layer; an insulating film embedded in the surface region of the second semiconductor layer between the third semiconductor layer and the fourth semiconductor layer; a gate insulating film formed on the first semiconductor layer and the second semiconductor layer between the third semiconductor layer and the insulating film; and a gate electrode formed on the gate insulating film. A first peak of an impurity concentration profile in the second semiconductor layer is formed at a position deeper than the insulating film.

BRIEF DESCRIPTION OF THE SEVERAL VIEWS OF THE DRAWING

FIG. 6 is a diagram showing the relation between the depth of peak positions of the impurity concentration profiles in the high voltage MOSFET in the embodiment and snap-back voltages;

FIGS. 7A and 7B are sectional views in a first step showing a method of manufacturing a high voltage MOSFET in the embodiment;

FIGS. 8A, 8B and 8C are sectional views in a second step showing the method of manufacturing the high voltage MOSFET in the embodiment;

FIGS. 9A, 9B and 9C are sectional views in a third step showing the method of manufacturing the high voltage MOSFET in the embodiment;

FIGS. 12A, 12B and 12C are sectional views in a sixth step showing the method of manufacturing the high voltage MOSFET in the embodiment;

FIGS. 13A, 13B and 13C are sectional views in a seventh step showing the method of manufacturing the high voltage MOSFET in the embodiment;

DETAILED DESCRIPTION OF THE INVENTION

Figure 1:
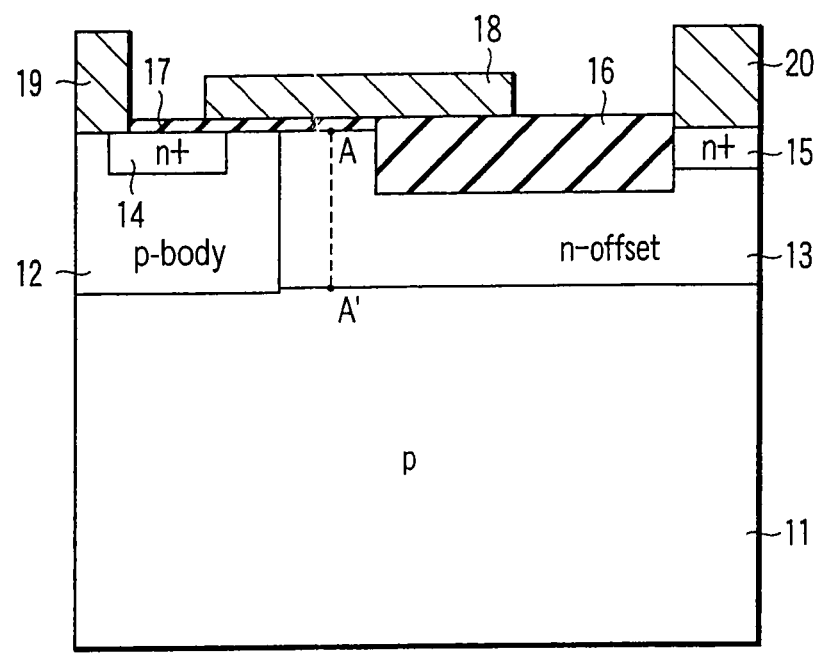
FIG. 1 is a sectional view showing the configuration of a high voltage MOSFET in an embodiment of a present invention.

A semiconductor device in an embodiment of this invention will hereinafter be described with reference to the drawings. In the description, common reference numerals are assigned to common parts throughout the drawings.

A high voltage MOS field effect transistor in the embodiment of this invention will be described. FIG. 1 is a sectional view showing the configuration of the high voltage MOSFET in the embodiment.

A p-type body layer 12 and an n-type offset layer 13 are formed on a p-type (or n-type) silicon semiconductor substrate 11. An n-positive-type source layer 14 is formed in a surface region of the p-type body layer 12. An n-positive-type drain layer 15 is formed in a surface region of the n-type offset layer 13. A trench is formed in the n-type offset layer 13 between the n-positive-type source layer 14 and the n-positive-type drain layer 15, and a silicon oxide film 16 is embedded in this trench.

A gate insulating film 17 is formed on the p-type body layer 12 and the n-type offset layer 13 between the n-positive-type source layer 14 and the n-positive-type drain layer 15. A gate electrode 18 is formed on the gate insulating film 17. A source electrode 19 is formed on the n-positive-type source layer 14. Moreover, a drain electrode 20 is formed on the n-positive-type drain layer 15.

It is to be noted that an example is shown here in which the p-type body layer 12 and the n-type offset layer 13 are directly formed on the semiconductor substrate 11. However, an n-positive-type semiconductor layer may be formed on the semiconductor substrate 11, and the p-type body layer 12 and the n-type offset layer 13 may be formed on the n-positive-type semiconductor layer.

Figure 2:
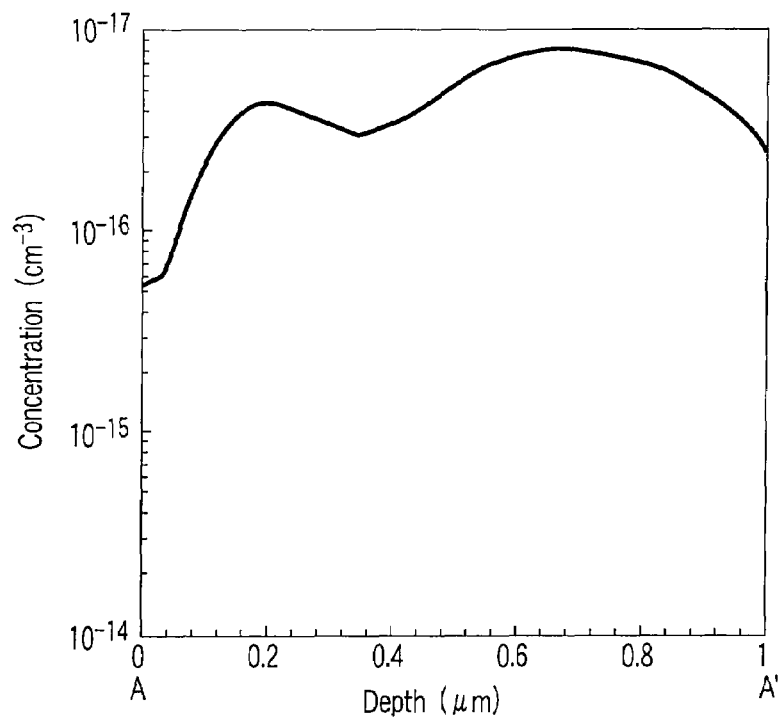
FIG. 2 is a diagram showing an impurity concentration profile in an n-type offset layer of the high voltage MOSFET in the embodiment.

An impurity concentration profile in the n-type offset layer 13 of the high voltage MOSFET shown in FIG. 1 is shown in FIG. 2. FIG. 2 shows the impurity concentration profile ranging from a surface (top surface) A to a bottom surface A' in the n-type offset layer 13. The depth of the trench embedded with the silicon oxide film 16 is about 0.35 µm, and the thickness of the n-type offset layer is about 1.0 µm.

Figure 3:
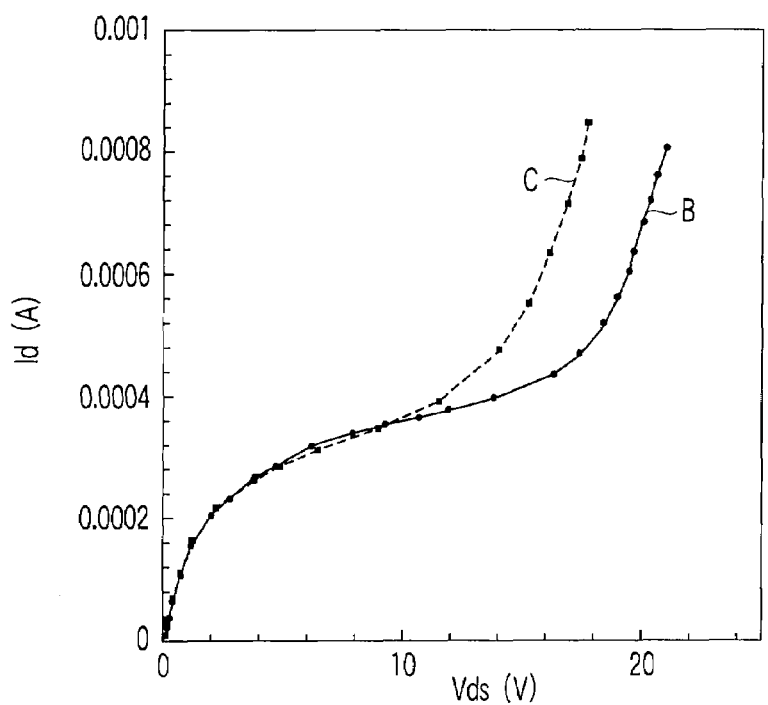
FIG. 3 is a diagram showing drain current characteristics during an on-operation in the high voltage MOSFET in the embodiment.
Figure 4:
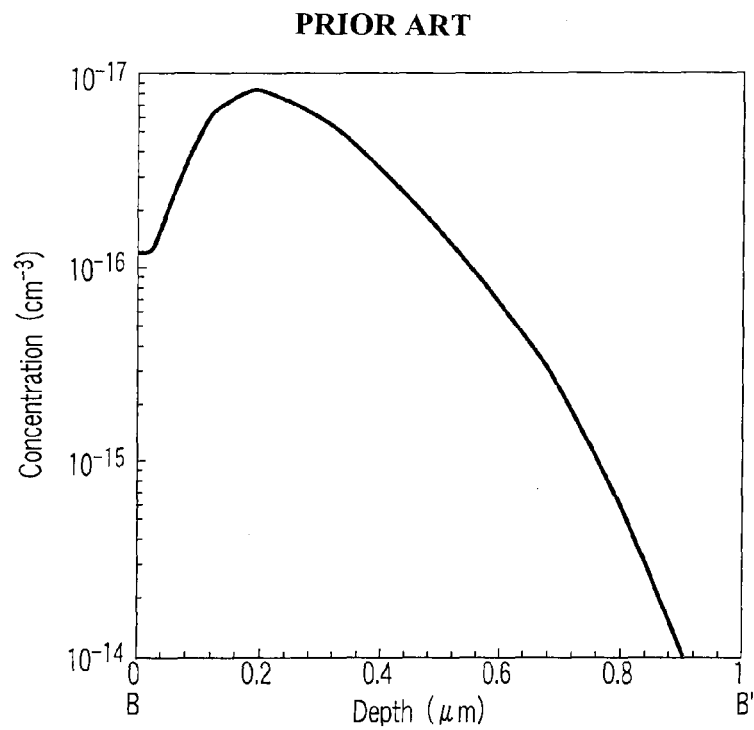
FIG. 4 is a diagram showing an impurity concentration profile in an n-type offset layer of a conventional high voltage MOSFET.

As shown in FIG. 2, a peak position of the impurity concentration profile is formed at a position deeper than the depth of the trench, that is, a position deeper than the bottom of the silicon oxide film 16. Characteristics of a drain current during an on-operation in the high voltage MOSFET at this point are shown in FIG. 3. A characteristic indicated by B in FIG. 3 is a characteristic in the high voltage MOSFET of the present embodiment, and this shows a case where a peak position of the impurity concentration profile is at a position deeper than the depth of the trench, for example, about 0.3 µm deep from the bottom of the trench (0.65 µm from the upper end of the trench), and the impurity concentration is $8 \times 10^{16}$ cm$^{-3}$. On the other hand, a characteristic indicated by C is a characteristic in a conventional MOSFET, and this shows a case where, as shown in FIG. 4, a peak position of the impurity concentration profile is at a position shallower than the depth of the trench, for example, about 0.2 µm deep from the upper end of the trench, and the impurity concentration is $8 \times 10^{16}$ cm$^{-3}$.

Next, the relation between the peak position of the impurity concentration profile in the n-type offset layer 13 of the high voltage MOSFET and the drain current will be described.

Figure 5:
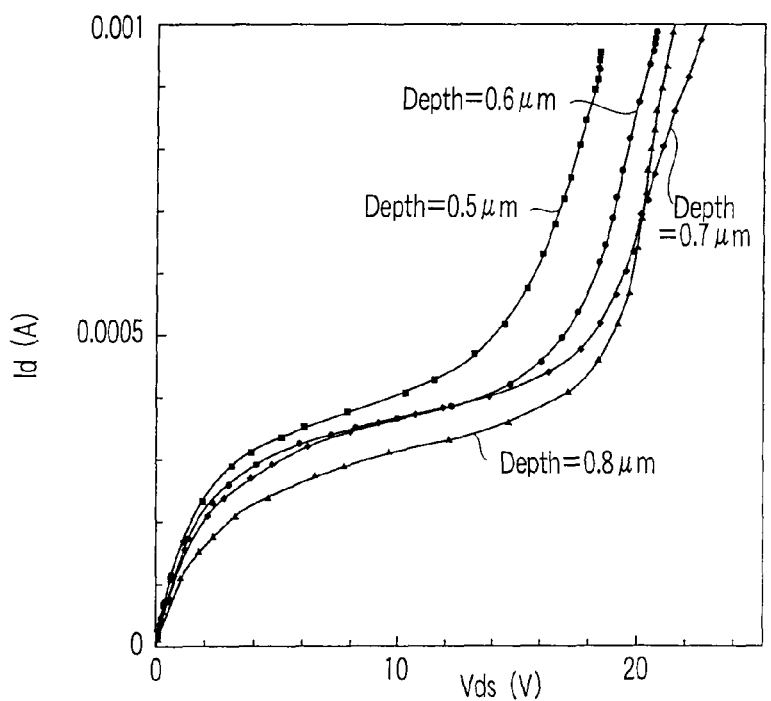
FIG. 5 is a diagram showing details of the drain current characteristics during an on-operation in the high voltage MOSFET in the embodiment.

FIG. 5 is a diagram showing the drain current when the peak position (depth) of the impurity concentration profile in the n-type offset layer 13 of the high voltage MOSFET is set as a parameter. When the peak position of the impurity concentration profile is 0.5 µm to 0.8 µm deep from the upper end of the trench, a drain current Id changes as shown in FIG. 5. A snap-back voltage at this moment is 16.8 V to 20.3 V, as shown in FIG. 6. Therefore, the peak position of the impurity concentration profile in the n-type offset layer 13 is made deeper than the trench (the silicon oxide film 16) such that a high snap-back voltage can be maintained.

Next, a method of manufacturing the high voltage MOSFET in the embodiment shown in FIG. 1 will be described.

FIGS. 7A and 7B to FIG. 14 are sectional views in the respective steps showing the method of manufacturing the high voltage MOSFET in the embodiment.

As shown in FIG. 7A, a silicon nitride film 21 is formed on the p-type silicon semiconductor substrate 11 by a CVD method. Further, as shown in FIG. 7B, a resist film 22 having an opening is formed on the silicon nitride film 21 by a photolithographic method. Then, the silicon nitride film 21 is etched by an RIE method as shown in FIG. 8A, and the resist film 22 is removed as shown in FIG. 8B, thereby forming the silicon nitride film 21 used to form a trench.

Next, the silicon semiconductor substrate 11 is etched by the RIE method to form a trench, and then the silicon oxide film 16 is formed in the trench on the semiconductor substrate 11 and on the silicon nitride film 21 by the CVD method, as shown in FIG. 8C. Further, the silicon oxide film 16 on the silicon nitride film 21 is polished by a CMP method, thereby leaving the silicon oxide film 16 in the trench, as shown in FIG. 9A.

Figure 10A:
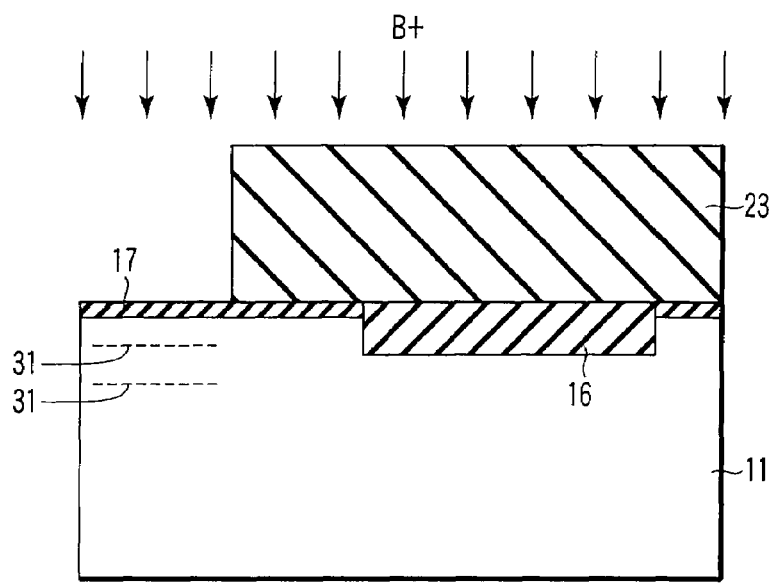
FIGS. 10A, 10B and 10C are sectional views in a fourth step showing the method of manufacturing the high voltage MOSFET in the embodiment.
Figure 10B:
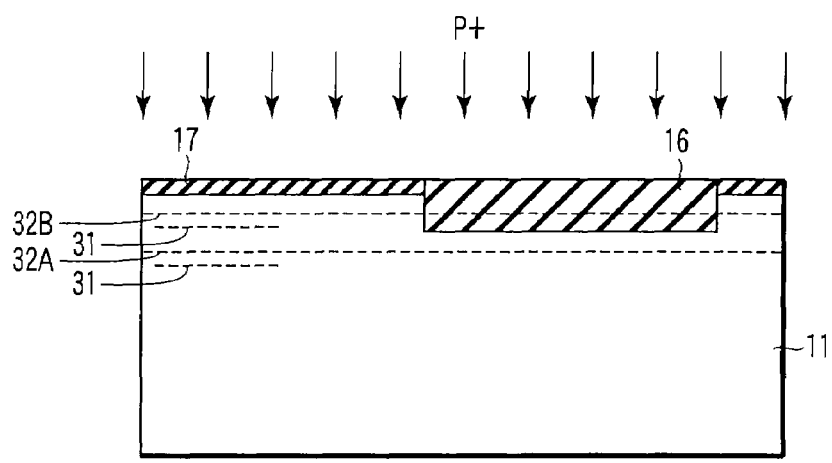
Figure 10C:
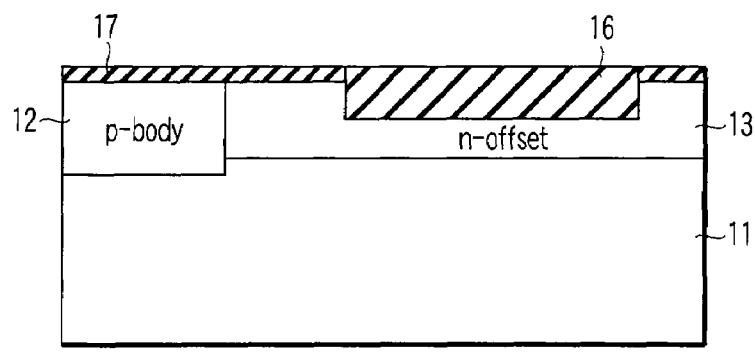

Subsequently, as shown in FIG. 9B, the silicon nitride film 21 on the semiconductor substrate 11 is removed. Further, as shown in FIG. 9C, the gate insulating film 17 is formed on the semiconductor substrate 11 by a thermal oxidation method. Then, after a resist film 23 is formed by the photolithographic method as shown in FIG. 10A, boron ions [B+] are implanted by an ion implantation method into an area 31 indicated by broken lines in the semiconductor substrate 11 in order to form the p-type body layer 12. Moreover, after the resist film 23 is removed as shown in FIG. 10B, phosphorus ions [P+] are implanted by the ion implantation method into areas 32A and 32B indicated by broken lines in the semiconductor substrate 11 in order to form the n-type offset layer 13. At this point, the phosphorus ions [P+] are implanted into a position deeper than the depth of the trench, that is, a position 32A deeper than the bottom of the silicon oxide film 16, and into a position shallower than the depth of the trench, that is, a position 32B deeper than the bottom of the silicon oxide film 16. Then, a heat treatment is carried out, and the p-type body layer 12 and the n-type offset layer 13 are formed on the semiconductor substrate 11, as shown in FIG. 10C.

Figure 11A:
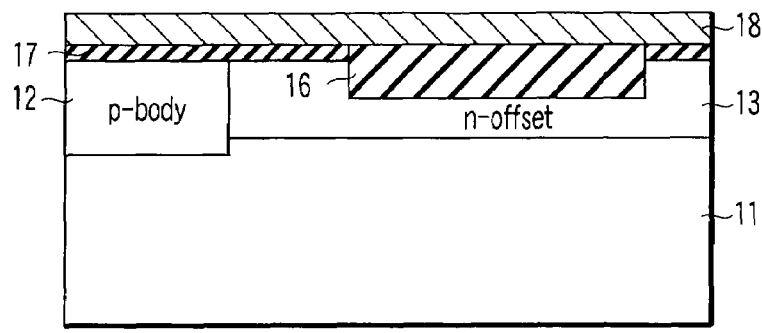
FIGS. 11A, 11B and 11C are sectional views in a fifth step showing the method of manufacturing the high voltage MOSFET in the embodiment.
Figure 11B:
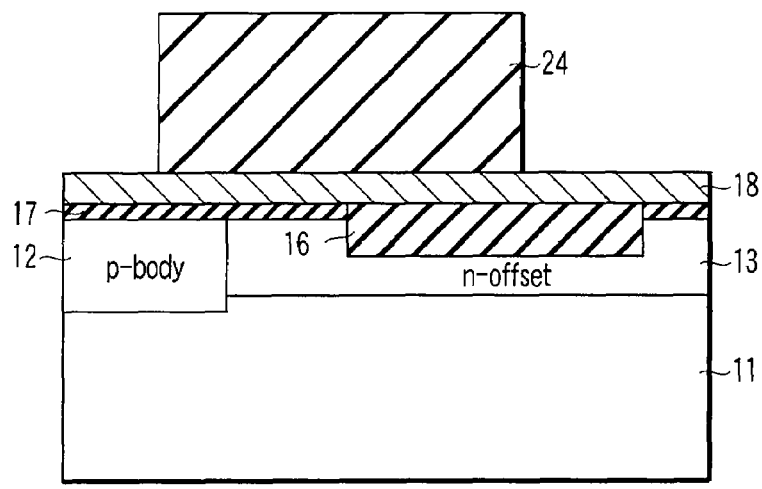
Figure 11C:
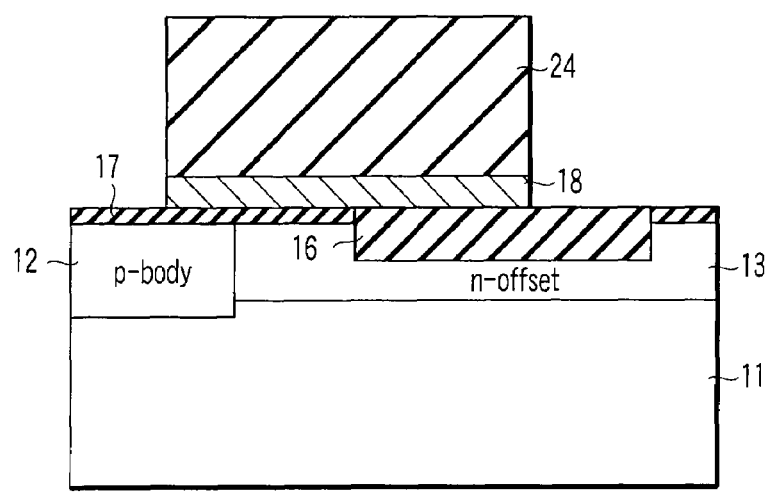

Next, as shown in FIG. 11A, the polysilicon film 18 to be the gate electrode is formed on the gate insulating film 17 and the silicon oxide film 16. Then, a resist film 24 is formed on the polysilicon film 18 by the photolithographic method as shown in FIG. 11B, and the polysilicon film 18 is etched by the RIE method as shown in FIG. 11C, thereby forming the gate electrode 18.

Subsequently, after the resist film 24 is released, a resist film 25 is formed by the photolithographic method, as shown in FIG. 12A. Then, arsenic ions [As+] are implanted by the ion implantation method into an area 33 indicated by broken lines in the p-type body layer 12 and the n-type offset layer 13. Then, the resist film 25 is removed, and a heat treatment is carried out, thereby forming the n-positive-type source layer 14 in the p-type body layer 12 and also forming the n-positive-type drain layer 15 in the n-type offset layer 13, as shown in FIG. 12B.

Next, as shown in FIG. 12C, an insulating film 26 is formed on the structure shown in FIG. 12B. Then, after a resist film 27 is formed by the photolithographic method as shown in FIG. 13A, the insulating film 26 is etched by the RIE method, as shown in FIG. 13B. Subsequently, as shown in FIG. 13C, the resist film 27 is removed.

Figure 14:
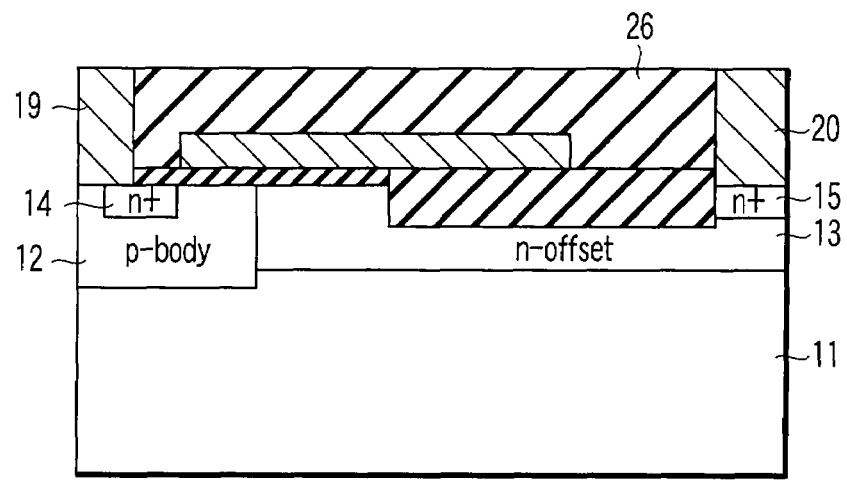
FIG. 14 is a sectional view in an eight steps showing the method of manufacturing the high voltage MOSFET in the embodiment.

Next, a metal film to be a source electrode and a drain electrode is deposited on the structure shown in FIG. 13C, and an extra metal film is removed by the CMP method as shown in FIG. 14, thereby forming the source electrode 19 and the drain electrode 20. In the manner described above, the high voltage MOSFET in the present embodiment is manufactured.

According to the semiconductor device having the manufacturing process described above, the peak position of the impurity concentration profile in the n-type offset layer 13 can be formed in a region deeper than the trench (the silicon oxide film 16). Thus, a high snap-back voltage during the on-operation can be maintained.

According to the embodiment of this invention, it is possible to provide a semiconductor device capable of improving the snap-back voltage during the on-operation.

The reason is described below why the high snap-back voltage during the on-operation can be maintained in the embodiment of this invention.

Figure 15A:
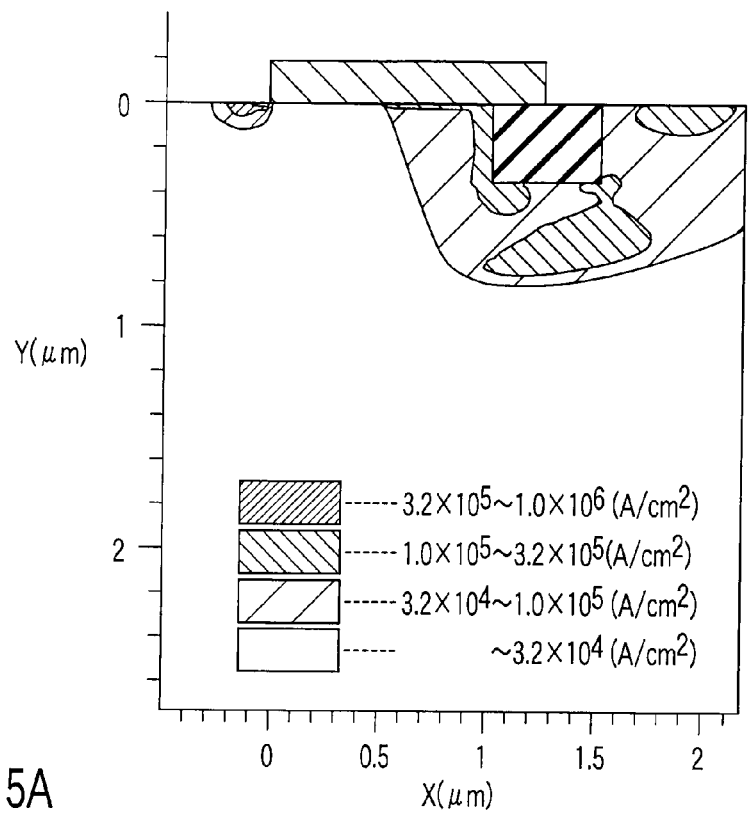
FIGS. 15A and 15B are diagrams showing electron current density distributions in the n-type offset layer in the embodiment (B in FIG. 3) and in the conventional example (C in FIG. 3)
Figure 15B:
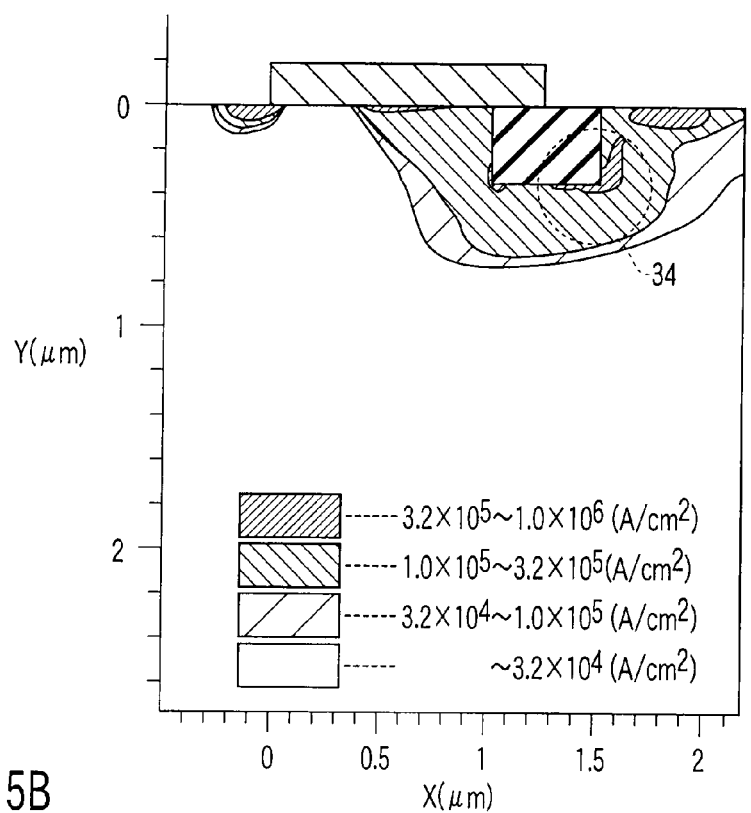

FIGS. 15A and 15B are diagrams showing electron current density distributions in the n-type offset layer 13 at a source-drain voltage Vds=17 V in the embodiment described above (B in FIG. 3) and in a conventional example (C in FIG. 3). As shown in FIG. 15B, in the conventional example, the peak of the profile of the impurity concentration is in a region shallower than the silicon oxide film 16 (here, a region about 0.20 μm deep), and there is no peak in regions deeper than the silicon oxide film 16, such that current density is higher on the periphery of the silicon oxide film 16, especially on the edge portion thereof (region enclosed by a broken line 34) where the impurity concentration is relatively high. On the contrary, as shown in FIG. 15A, since the peak of the profile of the impurity concentration is in a region deeper than the silicon oxide film 16 (here, a region about 0.65 μm deep) in the embodiment, the resistance in this region is reduced and current density is increased, thereby making it possible to drastically reduce the current density at the edge portion of the silicon oxide film 16.

Figure 16A:
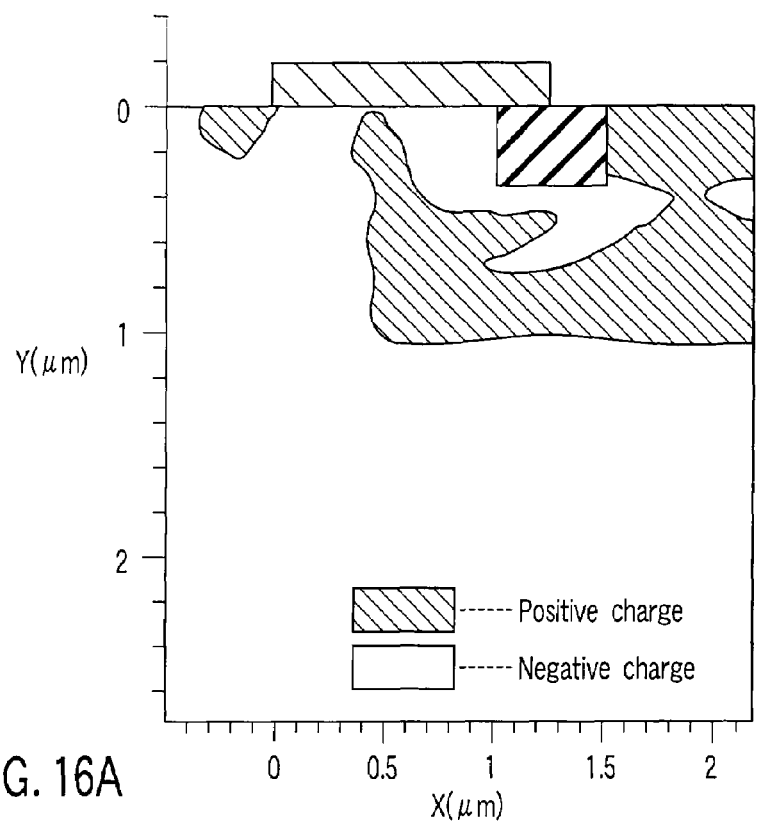
FIGS. 16A and 16B are diagrams showing space charge distributions in the n-type offset layer in the embodiment and in the conventional example.
Figure 16B:
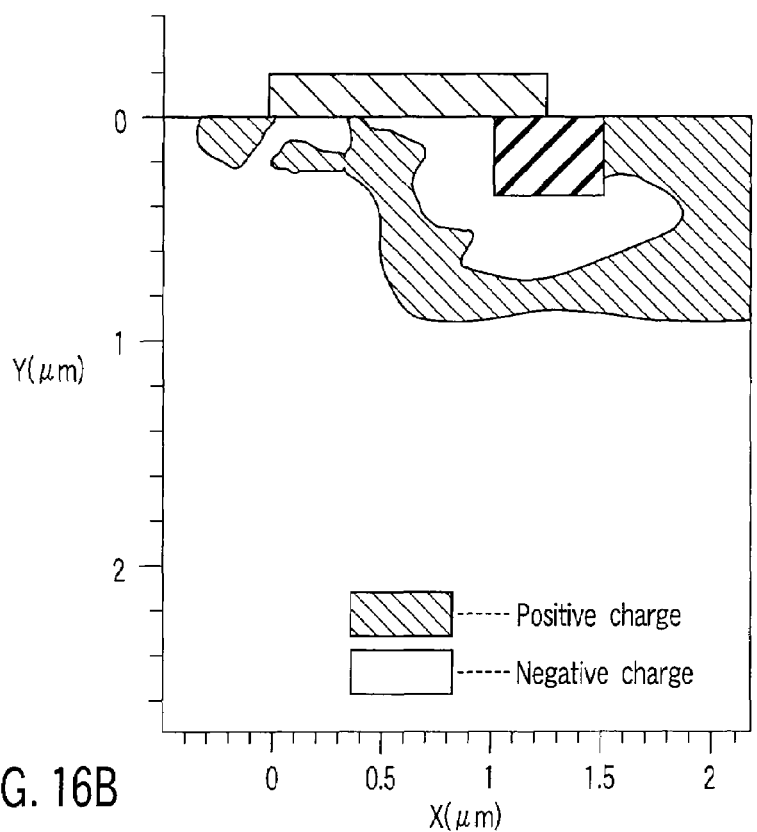

Space charge distributions in the n-type offset layer 13 at a voltage Vds=17 V at this point in the embodiment and in the conventional example are shown in FIGS. 16A and 16B. Since the n-type offset layer 13 is an n-type semiconductor, the n-type offset layer 13 is depleted when a voltage is applied across the source and drain. Due to this depletion, a positive space charge is formed in the n-type offset layer 13, such that a uniform electric field is formed, and high pressure resistance can be obtained.

Figure 17A:
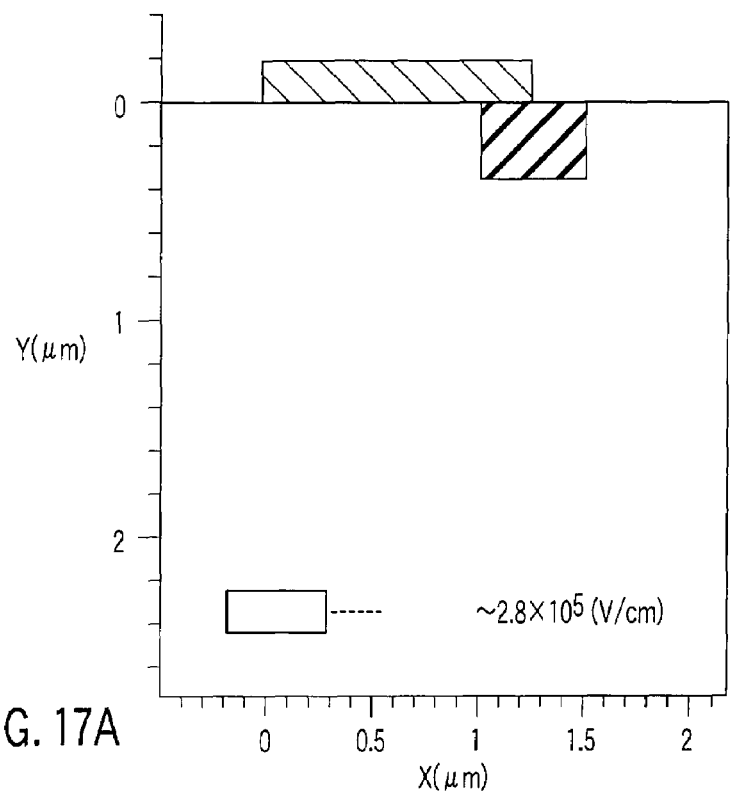
FIGS. 17A and 17B are diagrams showing electric field distributions in the n-type offset layer in the embodiment and in the conventional example.
Figure 17B:
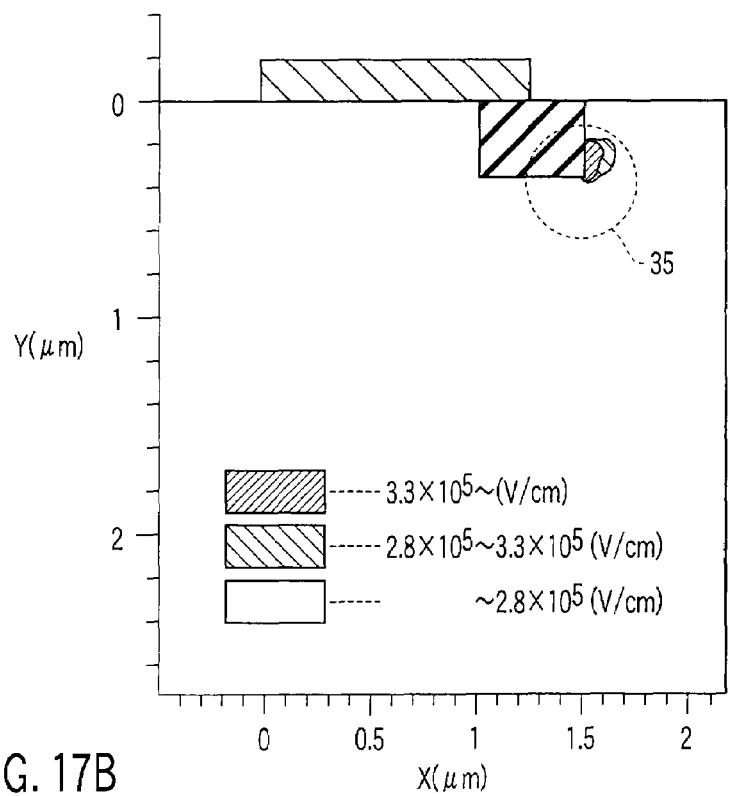
Figure 18A:
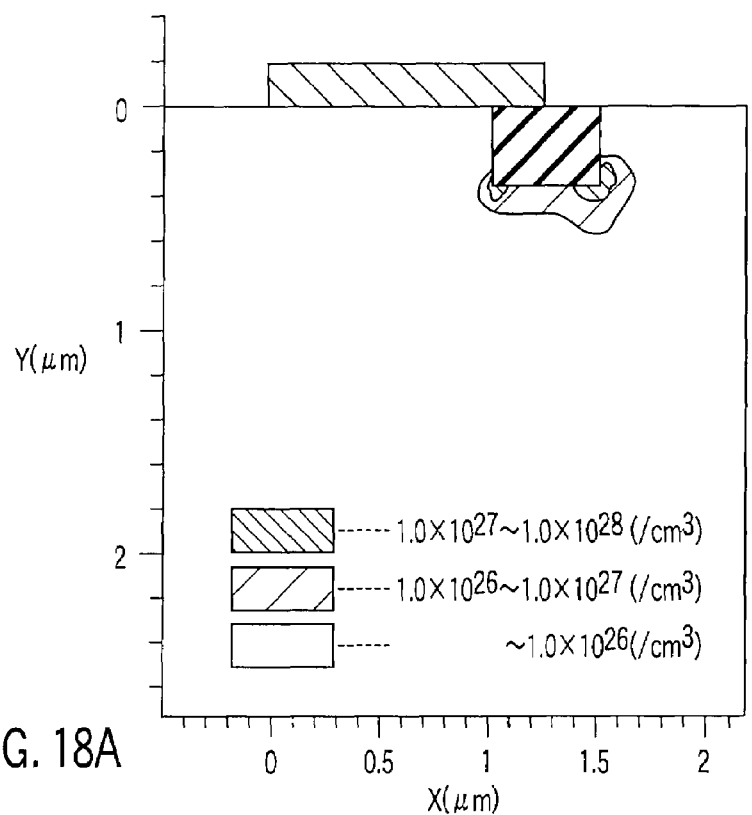
FIGS. 18A and 18B are diagrams showing impact ionization rate distributions in the n-type offset layer in the embodiment and in the conventional example.
Figure 18B:
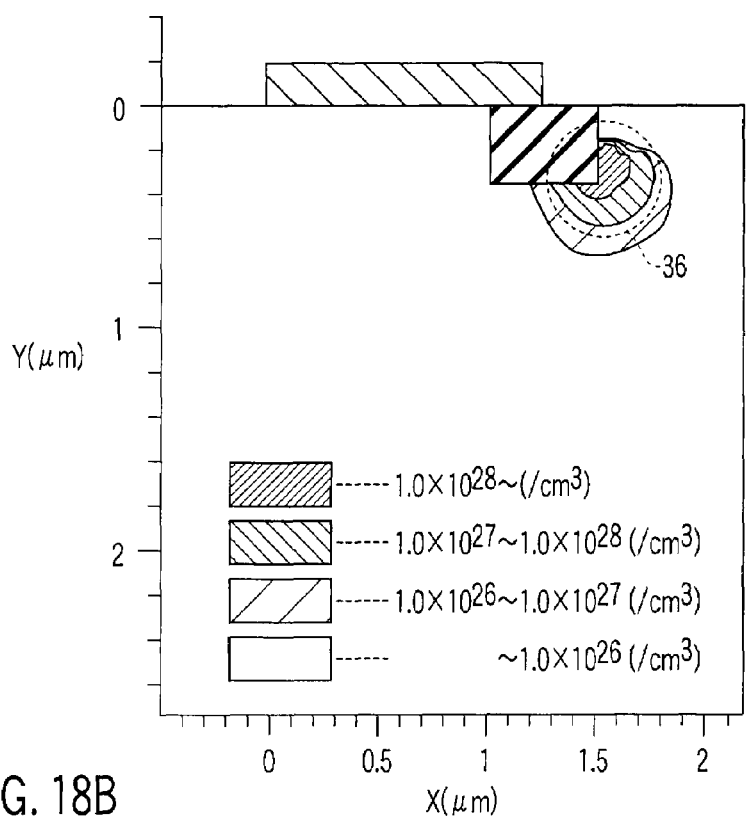

However, an electron current supplied from a channel concentrates on the edge portion of the silicon oxide film 16 in the conventional example as shown in FIG. 16B, such that the space charge is counteracted and the space charge in the n-type offset layer 13 has a negative value. Thus, the electric field in a region enclosed by a broken line 35 becomes high as shown in FIG. 17B, and an impact ionization rate in a region enclosed by a broken line 36 is high as shown in FIG. 18B. That is, in the conventional example, because carriers are generated by impact ionization, the snap-back voltage is lower, as indicated by C in FIG. 3. On the other hand, since the concentration of the current as in the conventional example is not caused in the embodiment described above, the positive space charge remains in the n-type offset layer 13 under the trench (the silicon oxide film 16), as shown in FIG. 16A. Thus, the electric field in the n-type offset layer 13 under the silicon oxide film 16 including the edge portion thereof is relaxed, and the increase of the impact ionization rate can be suppressed, thereby enabling the increased snap-back voltage.

For the same reason, it is also possible to explain the case where the peak position of the impurity concentration profile is 0.5 μl to 0.8 μl deep from the upper end of the trench as shown in FIG. 5. That is, the peak position of the impurity concentration profile in the n-type offset layer 13 can be made deeper than the trench (the silicon oxide film 16) to increase the snap-back voltage.

Figure 19:
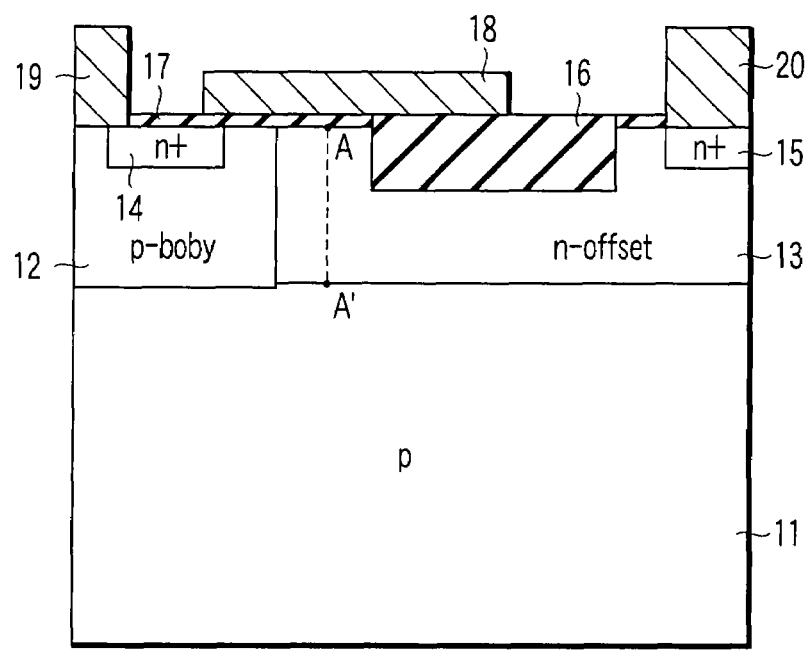
FIG. 19 is a sectional view showing a modification wherein an insulating film embedded in a trench in the n-type offset layer is separated from a drain layer.

Furthermore, as shown in FIG. 19, the peak of the impurity concentration profile is at a position deeper than the silicon oxide film 16, and in addition to this, the silicon oxide film 16 is separated from the n-positive-type drain layer 15 toward the gate electrode 18, in which case the path of a current changes and it is thus possible to further prevent the concentration of the current on the edge portion of the silicon oxide film 16 than in the structure shown in FIG. 1. According to such a structure shown in FIG. 19, the electric field in the edge portion of the silicon oxide film 16 is also relaxed, with the result that the generation of the carriers due to the impact ionization can be reduced and a high snap-back voltage can be maintained.

As described above, in the embodiment of this invention, since the peak position of the impurity concentration in the n-type offset layer 13 is in the region deeper than the silicon oxide film 16, the resistance in this deep region is reduced and the current density is thus increased, such that the current density in the edge portion of the silicon oxide film 16 can be low. Thus, the concentration of the current can be prevented, and the positive space charge can remain in the n-type offset layer 13 under the silicon oxide film 16, such that the electric field in the edge portion of the silicon oxide film 16 can be relaxed. As a result, the generation of the carriers due to the impact ionization can be reduced, thereby making it possible to maintain a high snap-back voltage.

It is to be noted that the embodiment described above is not the sole embodiment, and the configuration described above can be changed or various configurations can be added to form various embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor device comprising:
   a body layer of a first conductivity type;
   a source layer of a second conductivity type in a surface region of the body layer;
   an offset layer of the second conductivity type;
   a buried insulating film in a surface region of the offset layer;

a drain layer of the second conductivity type adjacent to the offset layer;

a gate insulating film at least on a surface region of a portion of the body layer between the source layer and the offset layer; and a gate electrode on the gate insulating film, wherein the offset layer is adjacent to the drain layer, and a portion of the offset layer is between the body layer and the buried insulating film, and an impurity concentration profile from a surface of the portion of the offset layer to a bottom of the offset layer has a first peak located at a position deeper than a bottom of the buried insulating film, and has a second peak located at a position shallower than the bottom of the buried insulating film.

2. The semiconductor device according to claim 1, wherein the second peak is lower than the first peak in concentration.

3. The semiconductor device according to claim 1, further comprising:

a source electrode over both the body layer and the source layer; and a drain electrode on the drain layer.

4. The semiconductor device according to claim 1, wherein the buried insulating film comprises shallow trench isolation (STI).

5. The semiconductor device according to claim 1, wherein a portion of the gate electrode is formed on a portion of the buried insulating film.

6. The semiconductor device according to claim 5, wherein the buried insulating film is in contact with the gate electrode.

7. The semiconductor device according to claim 1, wherein the buried insulating film is adjacent to the drain layer.

8. The semiconductor device according to claim 1, wherein a portion of the offset layer is located between the buried insulating film and the drain layer.

9. The semiconductor device according to claim 1, wherein the gate insulating film is adjacent to the buried insulating film, and the gate electrode is at least on the buried insulating film.

10. The semiconductor device according to claim 1, wherein the drain layer is in a surface region of the offset layer.

11. The semiconductor device according to claim 1, wherein the impurity concentration profile has a relative minimum located at a position adjacent to the bottom of the buried insulating film and between the first peak and the second peak.

12. The semiconductor device according to claim 11, wherein the buried insulating film comprises shallow trench isolation (STI).

13. The semiconductor device according to claim 12, wherein the second peak is lower than the first peak in concentration.

14. A semiconductor device comprising:

a first semiconductor layer of a first conductivity type;

a second semiconductor layer of a second conductivity type;

a third semiconductor layer of the second conductivity type in a surface region of the first semiconductor layer, the third semiconductor layer having an impurity concentration higher than that of the second semiconductor layer;

a fourth semiconductor layer of the second conductivity type in a surface region of the second semiconductor layer, the fourth semiconductor layer having an impurity concentration higher than that of the second semiconductor layer;

a buried insulating film in a surface region of the second semiconductor layer;

a gate insulating film at least on a surface region of a portion of the first semiconductor layer between the third semiconductor layer and the second semiconductor layer; and a gate electrode on the gate insulating film, wherein the second semiconductor layer is adjacent to the fourth semiconductor layer, and a portion of the second semiconductor layer is between the first semiconductor layer and the buried insulating film, and an impurity concentration profile from a surface of the portion of the second semiconductor layer to a bottom of the second semiconductor layer has a first peak located at a position deeper than a bottom of the buried insulating film, and has a second peak located at a position shallower than the bottom of the buried insulating film.

15. The semiconductor device according to claim 14, wherein the second peak is lower than the first peak in concentration.

16. The semiconductor device according to claim 14, further comprising:

a source electrode over both the first semiconductor layer and the third semiconductor layer; and a drain electrode on the fourth semiconductor layer.

17. The semiconductor device according to claim 14, wherein the buried insulating film comprises shallow trench isolation (STI).

18. The semiconductor device according to claim 14, wherein the gate electrode is formed on a portion of the buried insulating film.

19. The semiconductor device according to claim 18, wherein the buried insulating film is in contact with the gate electrode.

20. The semiconductor device according to claim 14, wherein the buried insulating film is adjacent to the fourth semiconductor layer.

21. The semiconductor device according to claim 14, wherein a portion of the second semiconductor layer is located between the buried insulating film and the fourth semiconductor layer.

22. The semiconductor device according to claim 14, wherein the gate insulating film is adjacent to the buried insulating film, and the gate electrode is at least on the buried insulating film.

23. The semiconductor device according to claim 14, wherein the fourth semiconductor layer is in a surface region of the second semiconductor layer.

24. The semiconductor device according to claim 14, wherein the impurity concentration profile has a relative minimum located at a position adjacent to the bottom of the buried insulating film and between the first peak and the second peak.

25. The semiconductor device according to claim 24, wherein the buried insulating film comprises shallow trench isolation (STI).

26. The semiconductor device according to claim 25, wherein the second peak is lower than the first peak in concentration.

* * * * *